United States Patent
Gibson et al.

(10) Patent No.: US 6,972,998 B1
(45) Date of Patent: Dec. 6, 2005

(54) DOUBLE DATA RATE MEMORY DEVICES INCLUDING CLOCK DOMAIN ALIGNMENT CIRCUITS AND METHODS OF OPERATION THEREOF

(75) Inventors: David Gibson, Suwanee, GA (US); Angus David Starr MacAdam, Atlanta, GA (US); Mike Farrell, Atlanta, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 97 days.

(21) Appl. No.: 10/774,904

(22) Filed: Feb. 9, 2004

(51) Int. Cl.$^7$ .............................................. G11C 11/34

(52) U.S. Cl. ................................. 365/189.05; 365/191

(58) Field of Search ........................... 365/189.05, 191

(56) References Cited

U.S. PATENT DOCUMENTS

| | | | |
|---|---|---|---|
| 5,815,462 A * | 9/1998 | Konishi et al. ............. | 365/233 |
| 5,896,347 A * | 4/1999 | Tomita et al. .............. | 365/233 |
| 6,052,329 A * | 4/2000 | Nishino et al. ............. | 365/233 |
| 6,292,428 B1 * | 9/2001 | Tomita et al. .............. | 365/233 |
| 6,873,199 B2 * | 3/2005 | Nishimura et al. ......... | 327/279 |
| 6,885,572 B2 * | 4/2005 | Fujisawa .................... | 365/63 |

OTHER PUBLICATIONS

"18 Mb Pipelined QDR™II SRAM Burst of 2, Advance Information" Integrated Device Technology, Inc., Aug. 2003, 20 pages.
"Quad Data Rate™ (QDR™) SRAM Clocking Scheme," Cypress Semiconductor Corporation, Feb. 16, 2000, 2 pages.
"QDR™II SRAM: A Design Guide," Cypress Semiconductor Corporation, Jun. 12, 2002, 6 pages.
"DDR2 Offers New Features and Functionality," designline, vol. 12, issue 2, 3$^{rd}$ Quarter 2003, 16 pages.
"DDR2 SDRAM, 256Mb: x4 x8, x16 DDR2 SDRAM," Micron Technology, Inc., 2003, 99 pages.

* cited by examiner

*Primary Examiner*—M. Tran
(74) *Attorney, Agent, or Firm*—Myers Bigel Sibley & Sajovec

(57) ABSTRACT

An integrated circuit memory device includes a memory, a read control circuit operatively associated with the memory and configured to produce data from the memory responsive to an externally-applied input clock signal, and an output latch configured to transfer data at an input thereof to an output pad of the memory device responsive to an externally-applied output clock signal. The device further includes a clock domain alignment circuit configured to receive the data produced by the memory and to responsively provide the data at the input of the output latch based on relative timing of the input clock signal and the output clock signal.

20 Claims, 8 Drawing Sheets

DOUBLE DATA RATE MEMORY DEVICES INCLUDING CLOCK DOMAIN ALIGNMENT CIRCUITS AND METHODS OF OPERATION THEREOF

BACKGROUND OF THE INVENTION

The present invention relates to memory devices and methods of operation thereof, and more particularly, to memory devices with double data rate interfaces and methods of operation thereof.

A continuing push for higher-bandwidth data processing for communications and other electronics applications has created a need for a new level of performance from memory devices, such as random access memory (RAM) and content-addressable memory (CAM) devices. Recently, high-speed memory devices having a "double data rate" (DDR) format have been developed. These devices can overcome limitations of traditional memory devices and provide levels of performance needed for high data rate applications. In a typical DDR device, data is clocked on the rising and falling edges of the respective read or write clock signals. This can effectively double the bandwidth of the device without increasing the clock speed or the bus width, such that, for example, a 250-MHz DDR device can operate at a performance equivalent to that of a 500-MHz device. These devices typically are tailored for applications that have a nearly equal ratio of read and write cycles that occur very close in time to each other, such as in IP packet processing operations.

A variety of different DDR interfaces have been developed. A group of companies, including Integrated Device Technology, Inc., Micron Technology, Inc., and Cypress Semiconductor Corp., has developed a Quad Data Rate™ (QDR™) interface for memory devices, such as static random access memory (SRAM) devices. In contrast to traditional synchronous SRAM devices, which typically synchronize both input and output registers to a single clock signal (or clock signal pair), a QDR™ SRAM device includes separate DDR input and DDR output ports that are synchronized to respective externally-supplied input ("K/K#") and output ("C/C#") complementary clock signal pairs, as shown in FIG. 1. The use of the separate clock signal pairs allows system designers to compensate for flight time differences between chips (e.g., arising from different lead lengths), which can become significant as bus data rates increase. Examples of applications of the QDR™ interface are described in *Quad Data Rate™ (QDR™) SRAM Clocking Scheme*, published by Cypress Semiconductor Corporation (Feb. 16, 2000).

The original QDR™ interface has recently been supplanted by a new QDR™II interface specification. A memory device 30 having a QDR™ interface 32 is shown schematically in FIG. 2. The QDR™II interface 32 is similar to the original QDR™ interface in many respects, but has a slightly modified read cycle timing and other features. A read cycle is initiated by the read/write logic 33 on a rising edge of the K clock. Data is responsively provided at the output registers 35 on the rising edges of the complementary C and C# clocks. The QDR™II interface also provides "echo clocks" CQ and CQ#, which are complementary signals that match the C, C# clocks in frequency. The rising edges of CQ are referenced to the rising edges of C, while the rising edges of CQ# are referenced to the rising edges of C#. The echo clocks CQ and CQ# can be used to correctly latch data received from the QDR™II device at another device.

Although the provision of independent input and output clocks in a QDR™II interface can provide several advantages, the independent nature of the clocks can create timing issues within the device. In particular, in a read cycle, data may be produced from the memory responsive to the input clock K. Consequently, depending on skew of the anticipatory clock AC#, it may be problematic to meet setup and hold time requirements for the output registers.

SUMMARY OF THE INVENTION

According to some embodiments of the present invention, an integrated circuit memory device includes a memory, a read control circuit operatively associated with the memory and configured to produce data from the memory responsive to an externally-applied input clock signal, and an output latch configured to transfer data at an input thereof to an output pad of the memory device responsive to an externally-applied output clock signal. The device further includes a clock domain alignment circuit configured to receive the data produced by the memory and to responsively provide the data at the input of the output latch based on relative timing of the input clock signal and the output clock signal.

In certain embodiments of the present invention, an integrated circuit memory device includes a memory and a memory interface circuit configured to receive a complementary input clock signal pair and a complementary output clock signal pair and operative to initiate reading of the memory synchronous with the input clock signal pair. The memory interface circuit includes an output latch configured to transfer read data at an input thereof to an output pad of the memory device responsive to the output clock signal pair. The memory device further includes a clock domain alignment circuit configured to receive data from the memory and to selectively hold the data at the input of the output latch based on relative timing of the input clock signal pair and the output clock signal pair.

In some embodiments, the clock domain alignment circuit includes a data input configured to receive the data produced by the memory, a data latch having an input coupled to the data input and configured to transfer the data to the input of the output latch and to hold the data at the input of the output latch responsive to an alignment control signal, and a switch configured to couple the data input to the input of the output latch to bypass the data latch responsive to the alignment control signal. The clock domain alignment circuit further includes a control circuit that generates the alignment control signal responsive to one of the input clock signals and one of the output clock signals. The memory device may further include a delay locked loop circuit that generates an anticipatory clock signal that is synchronized with the output clock signal pair and an output latch enable pulse generator that generates respective output latch enable pulses corresponding to respective edges of the anticipatory clock signal. The output latch may transfer data from its input to the external pin responsive to the output latch enable pulses and the control circuit may include a first pulse generator that generates respective pulses corresponding to respective edges of the anticipatory clock signal, a second pulse generator that generates respective pulses corresponding to respective edges of one the input clock signals, and a flip-flop that generates the alignment control signal responsive to the pulses generated by the first and second pulse generators. The second pulse generator may be configured to suppress generation of pulses within a predetermined time interval (e.g., a "blanking interval") with respect to pulses generated by the first pulse generator.

In further embodiments of the present invention, an integrated circuit memory device includes a memory and a memory interface circuit configured to receive a complementary input clock signal pair and a complementary output clock signal pair and operative to initiate reading of the memory synchronous with the input clock signal pair and to generate a read cycle status signal indicative of a status of a data read cycle of the memory. The memory interface circuit includes an output latch configured to transfer read data at an input thereof to an output pad of the memory device responsive to the output clock signal pair. The memory device further includes a clock domain alignment circuit configured to transfer data to the input of the output latch based on relative timing of the read cycle status signal and the output clock signal pair.

In certain embodiments of the present invention, the memory device further includes a delay locked loop circuit that generates an anticipatory clock signal that is synchronized with the output clock signal pair. The output latch may transfer data responsive to the anticipatory clock signal. The clock domain alignment circuit may include a clock domain alignment latch that receives data from the memory and transfers the data to the output latch responsive to a signal at a clock signal input thereof, a data valid signal generator that generates a data valid signal indicative of the presence of valid data at an output of the memory, a delay circuit that generates a delayed anticipatory clock signal from the anticipatory clock signal, a latch that samples the data valid signal responsive to the delayed anticipatory clock signal to generate a select signal, and a mux that selectively applies the data valid signal and one of the input clock signal pair to the clock signal input of the clock domain alignment latch responsive to the select signal.

Methods of operating memory devices are also provided.

DETAILED DESCRIPTION OF EMBODIMENTS

Figure 1:
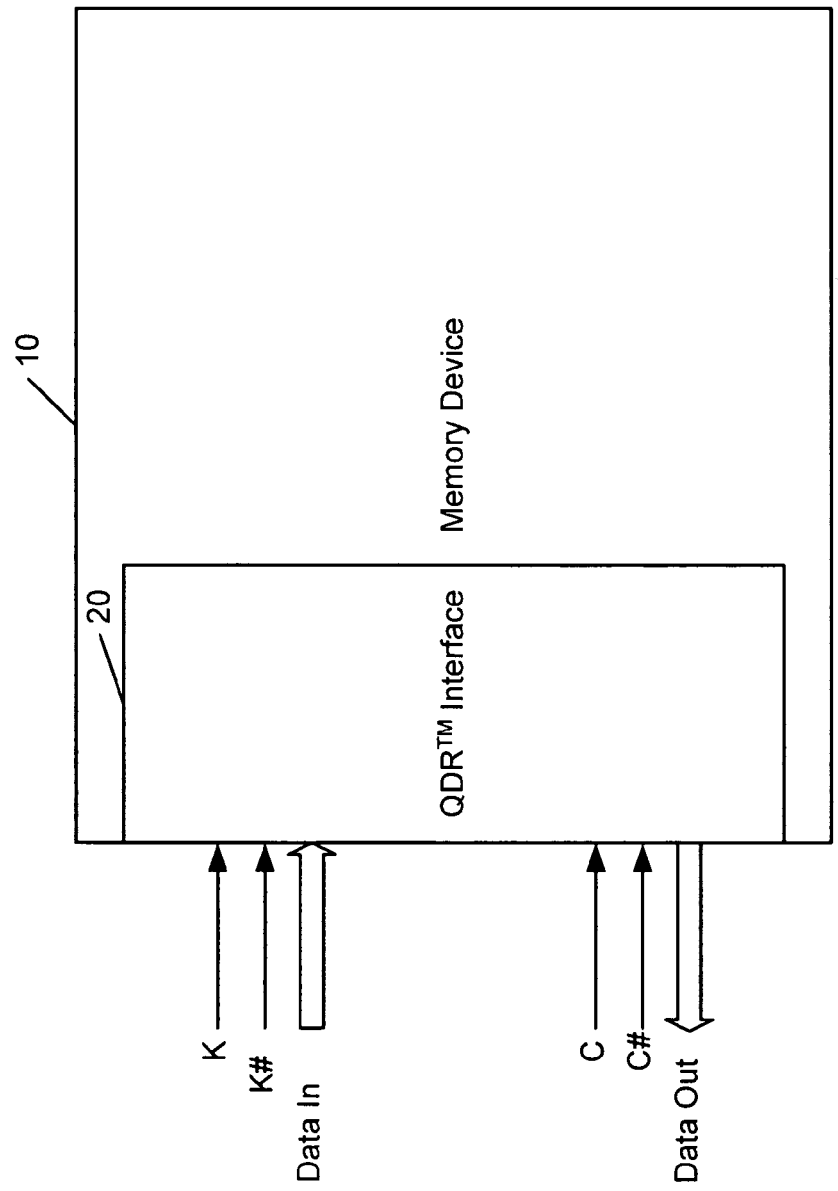
FIG. 1 is a schematic diagram of a conventional QDR™ memory device.
Figure 2:
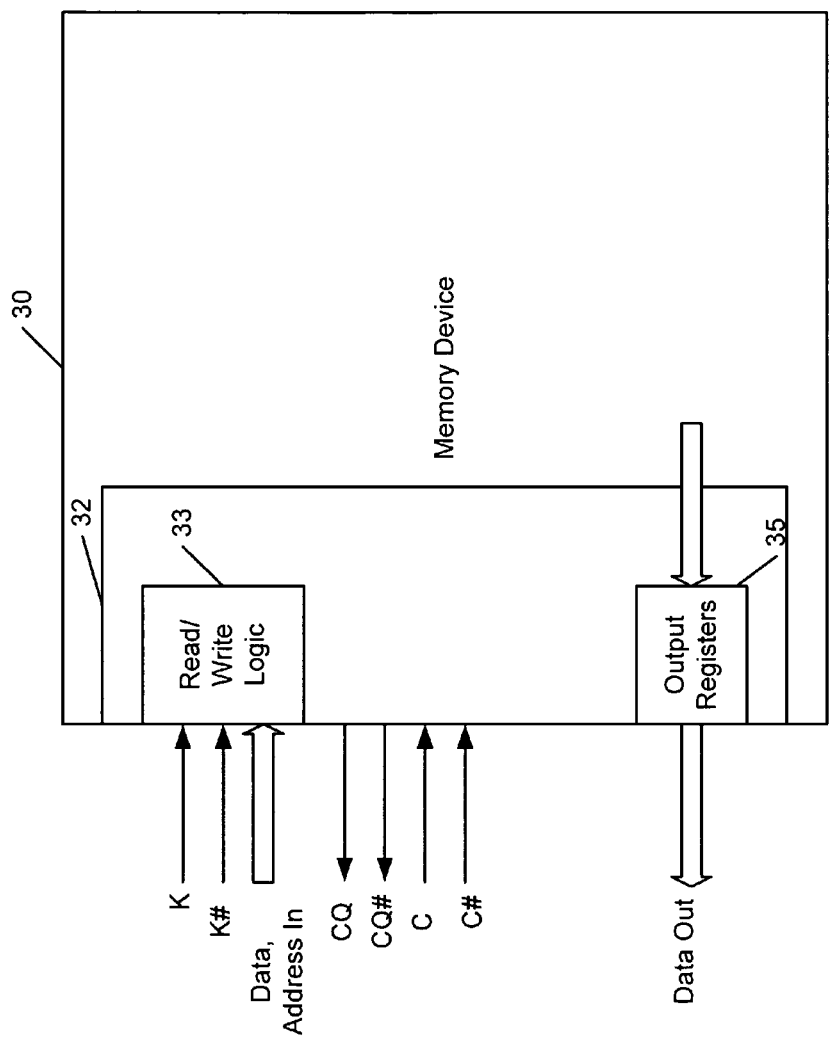
FIG. 2 is a schematic diagram of a conventional QDR™II memory device.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements. It will be understood that when an element is referred to as being "connected" or "coupled" to another element, it can be directly connected or coupled to the other element or intervening elements may be present.

Exemplary embodiments of the present invention described below refer to memory devices. For purposes of the present application, "memory devices" include devices that perform information storage functions, including, but not limited to, random access memory (RAM) devices, content addressable memory (CAM) devices, first-in-first-out (FIFO) devices, and devices that include memory "cells" or "cores", such as packet processing devices. The exemplary embodiments herein refer to alignment of data with respect to clock signals that are provided in the form of complementary clock signal pairs. It will be appreciated, however, that the present invention also encompasses embodiments that use single ended clock signals, instead of complementary clock signals.

Figure 3:
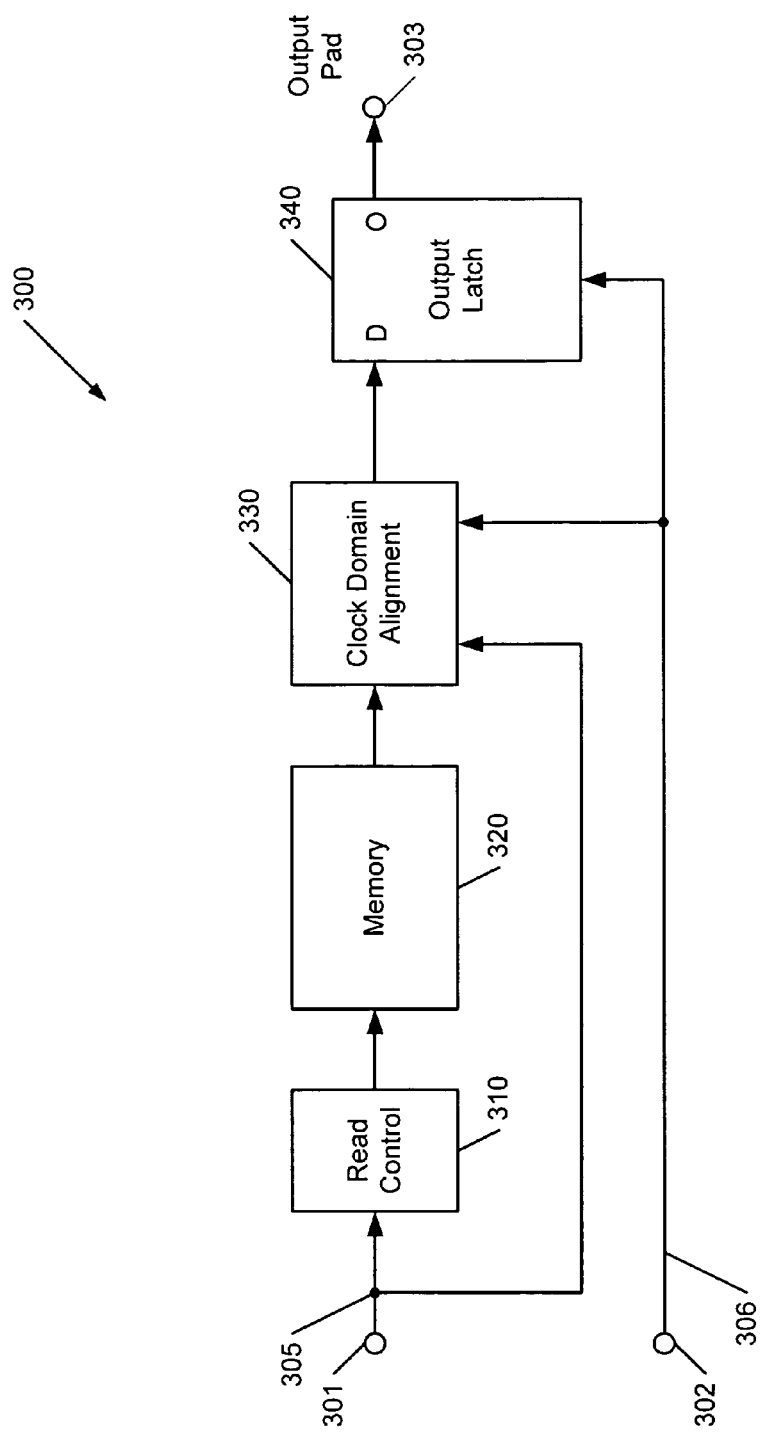
FIG. 3 is a schematic diagram of a memory device according to some embodiments of the present invention.

FIG. 3 illustrates a memory device 300 according to some embodiments of the present invention. The memory device 300 includes a memory 320, e.g., an SRAM, CAM, or other memory array. A read control circuit 310 is associated with the memory 320, and is operative to produce data therefrom in synchronism with an externally applied input clock signal 305 applied to an input pad 301, e.g., as in a QDR™II device. The memory device 300 further includes an output latch 340 that is configured to transfer data from an input D thereof to an output pad 303 of the device 300 responsive to an externally applied output clock signal 306 applied to an input pad 302. The device further includes a clock domain alignment circuit 330 that is configured to receive data produced by the memory 320 and operative to transfer data to the input D of the output latch and to hold data thereat based on a timing relationship between the input and output clock signals 305, 306.

It will be appreciated that the component circuits of the memory device 300 may be implemented in a number of different ways within the scope of the present invention. In particular, it will be understood that combinatorial and/or sequential logic functions provided by such circuits as that read control circuit 310, the clock domain alignment circuit 330 and the output latch 340, may be implemented using a variety of different combinations of combinatorial and/or sequential logic circuits that can provide the indicated functionality. It will be further appreciated that the memory 320 may include random access memory and/or content-addressable memory.

Figure 4:
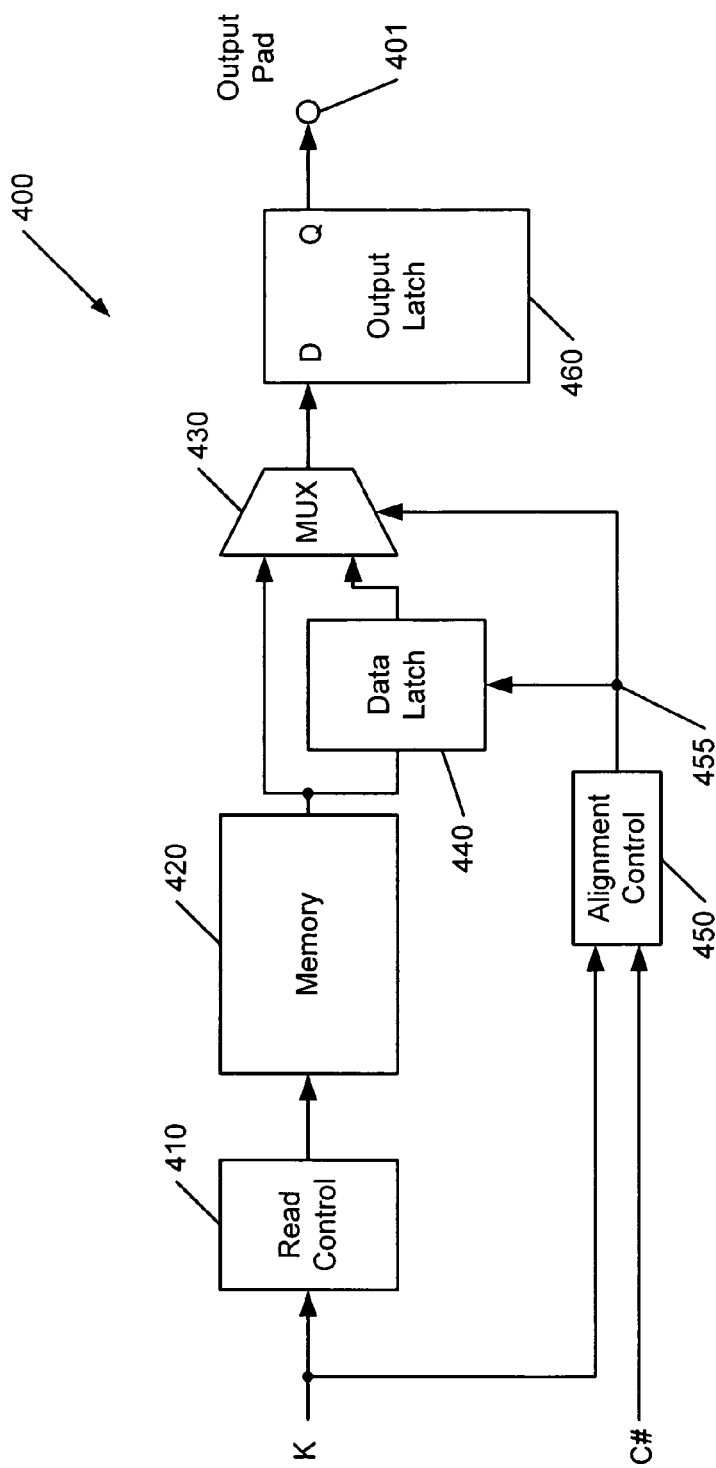
FIG. 4 is a schematic diagram of a memory device according to further embodiments of the present invention.

FIG. 4 illustrates a memory device 400 according to further embodiments of the present invention. The memory device includes a memory 420, e.g., an array of SRAM or CAM cells and associated control circuitry. The memory device 400 is responsive to an input clock signal K and an output clock signal C#, such as might be provided in a device having a QDR™II interface. It will be appreciated that the clock signals K, C# may be buffered or otherwise processed in the device 400. The memory device 400 includes a read control circuit 410 that is operative to produce data from the memory 420 in synchronism with the input clock signal K and an output latch 460 that is configured to transfer data at an input D thereof to an output pad 401 of the device 400 is synchronism with the output clock signal C#. The memory device 400 also includes a multiplexer (mux) 430 and a data latch 440, each of which is configured to receive the data produced from the memory 420. The device further includes an alignment control circuit 450 that generates an alignment control signal 455 that is operative to control the mux 430 and the data latch 440 such that data produced by the memory 420 is transferred and held at the input D of the output latch 460 based on a timing relationship between the input clock signal K and the output clock signal C#. For example, as described in detail with reference to FIGS. 5 and 6A–6C, the alignment control circuit may cause data to either directly pass to the input D of the output latch 460 through the mux 430 or to be held at the input D of the output latch 460 by the data latch 440, depending on the skew of the output clock signal C# with respect to the input clock signal K.

Figure 5:
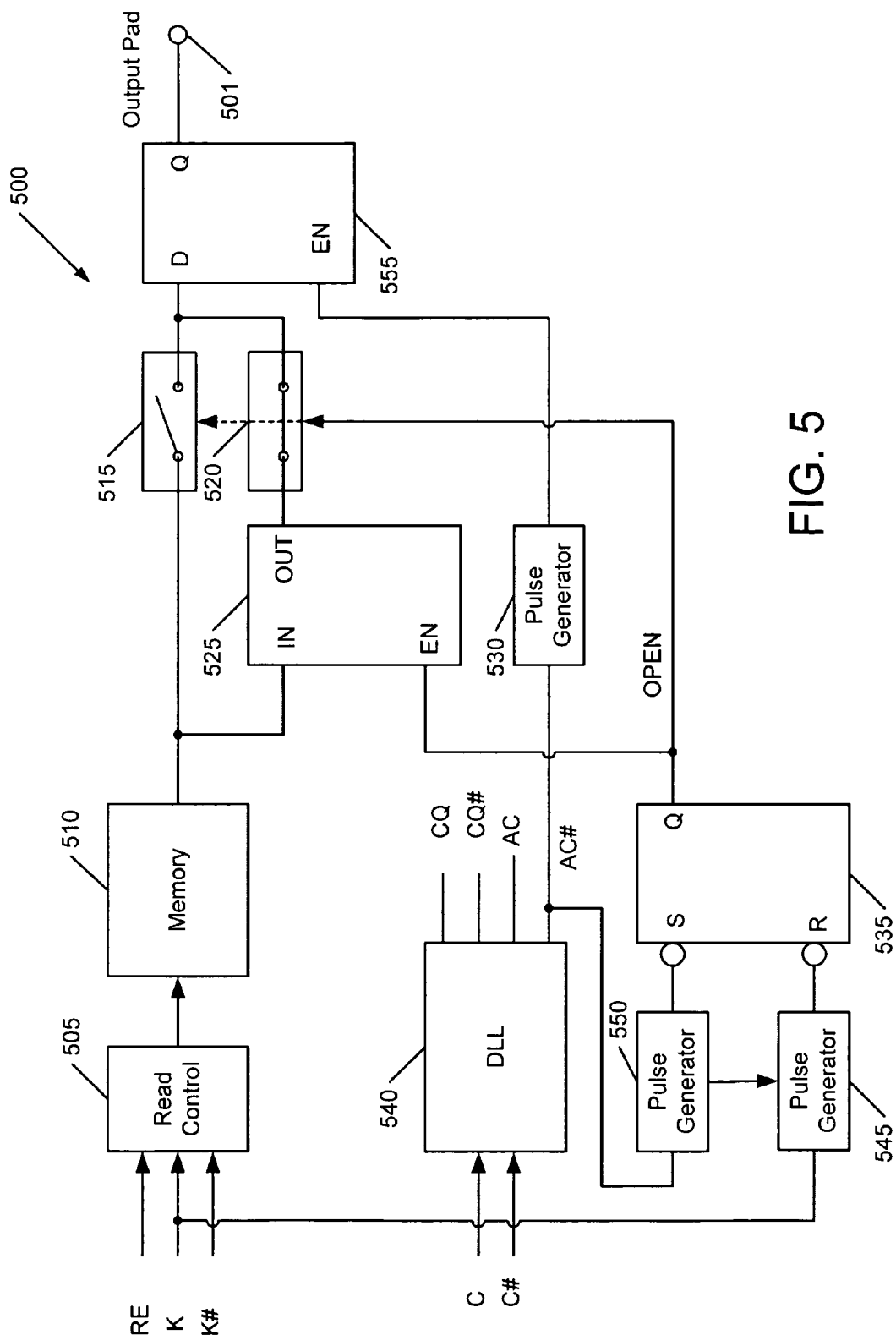
FIG. 5 is a schematic diagram of a memory device according to still further embodiments of the present invention.

FIG. 5 illustrates a memory device 500 including an exemplary implementation of the circuitry of FIG. 4 according to further embodiments of the present invention. The device 500 includes a read control circuit 505 that is responsive to the input clock signal K and a read enable signal RE. The read control circuit 505 controls reading from a memory 510, e.g., causes production of data from the memory 510, responsive to assertion of the read enable signal RE synchronous with the rising edge of the input clock signal K. The device 500 further includes a delay lock loop (DLL) circuit 540 that receives a complementary output clock signal pair C, C#, and that produces complementary echo clock signals CQ, CQ# (e.g., for provision to external signal pads) and complementary anticipatory clock signals AC, AC#. An output latch 555 is configured to transfer data present at its input D to an output pad 501 responsive to pulses generated by a pulse generator circuit 530 at respective positive edges of the anticipatory clock signals AC, AC#. Clock domain alignment is provided by a combination of first and second pulse generator circuits 545, 550, a set-reset (SR) flip-flop 535, switches 515, 520, and a data latch 525. In particular, the first and second pulse generator circuit 545, 550 are operative to respectively generate set and reset pulses corresponding to respective edges of the input clock signal K and the anticipatory clock signal AC#, i.e., consistent with clock signals used to control initiation of read cycles and output of data in a QDRII device. In response to the pulses generated by the first and second pulse generator circuits 545, 550, the SR flip-flop 535 generates a control signal OPEN that controls the switches 515, 520 and the data latch 525.

Figure 6A:
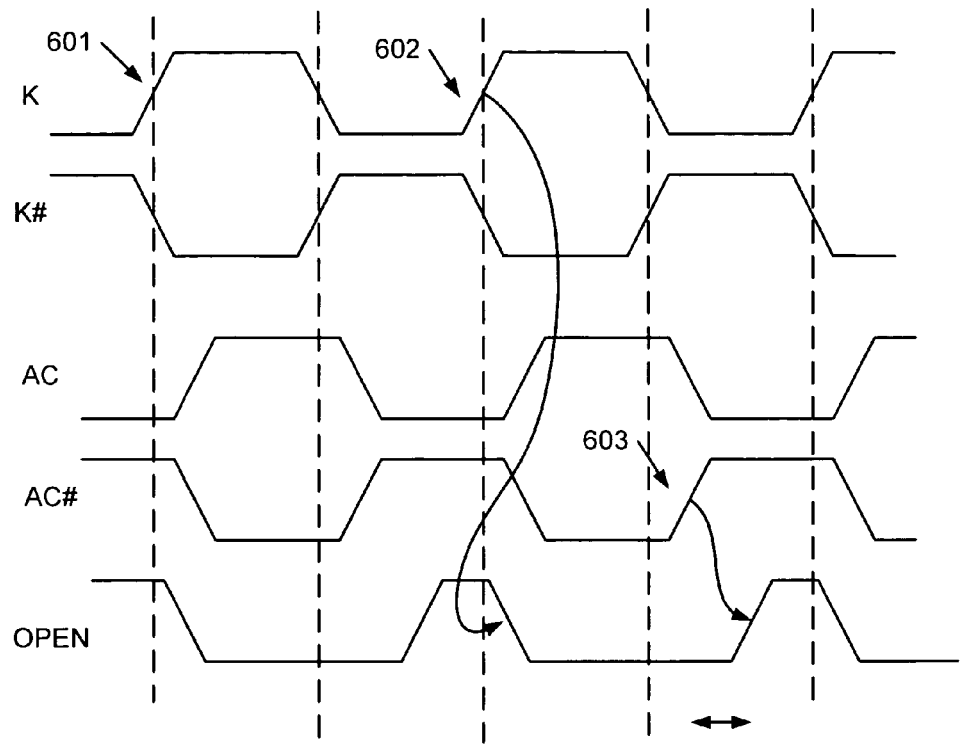
FIGS. 6A–6C are timing diagrams illustrating exemplary operations of the memory device of FIG. 5.
Figure 6B:
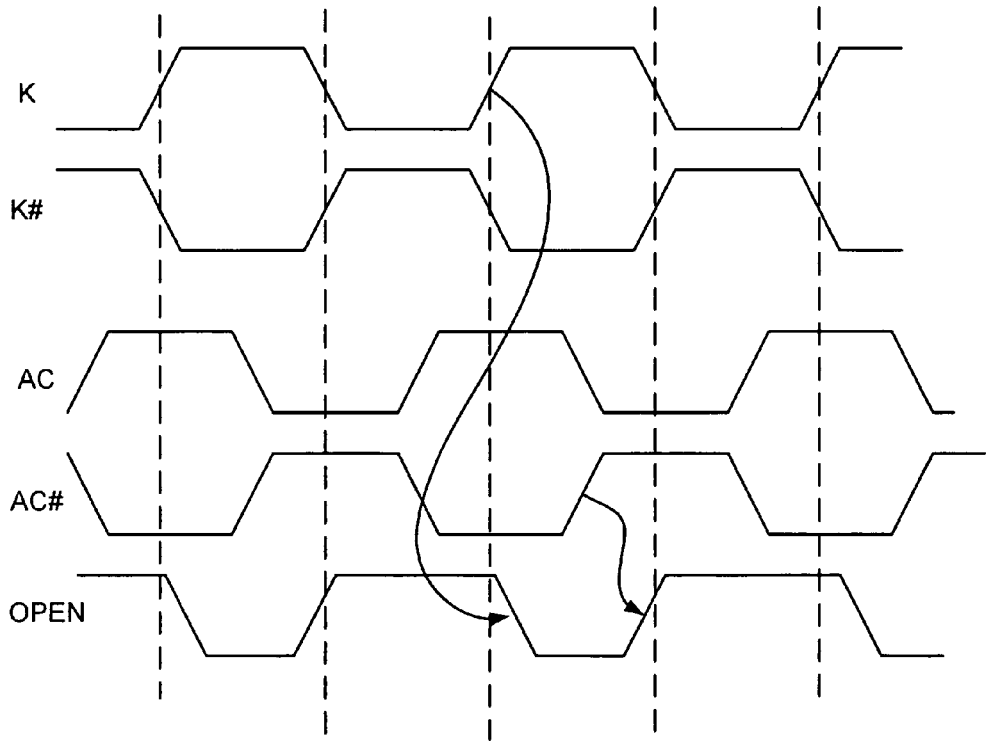
Figure 6C:
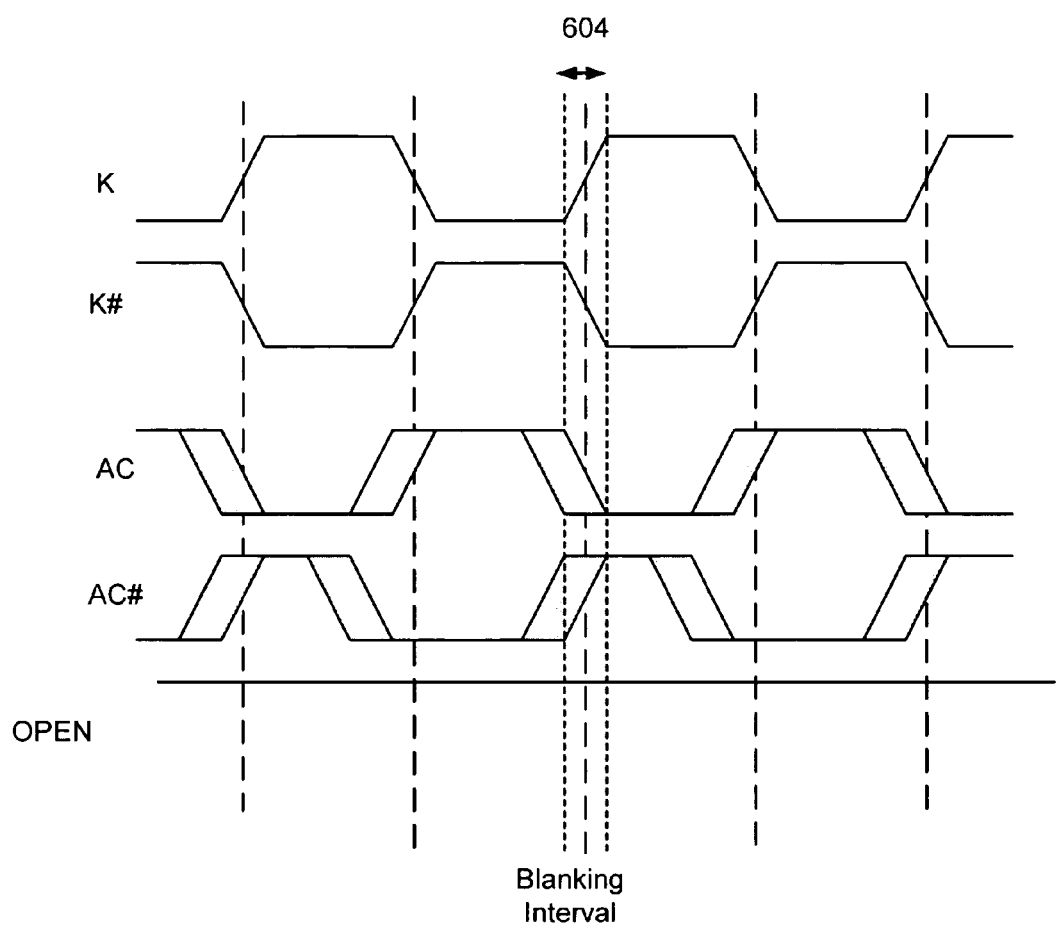

FIGS. 6A–6C illustrate exemplary operations of the device 500 of FIG. 5 for different timing relationships between the input clock signal K and the anticipatory clock signal AC#. As shown in FIG. 6A, when rising edges of the anticipatory clock signal AC# sufficiently lag the rising edges of the input clock signal K such that data from a particular read may disappear before a rising edge of the anticipatory clock signal AC# latches the data into the output latch 555, the alignment control circuitry acts to hold data in the data latch 525 until it can be latched into the output latch 555. In particular, a read instruction may be asserted on a first rising edge 601 of the input clock signal K. In response to a next rising edge 602 of the input clock signal K, the flip-flop 535 is reset, driving the alignment control signal OPEN to a logic low. This causes data at the input IN of the data latch 525 to be latched at the output OUT of the data latch 525, the bypass switch 515 to be closed and the switch 520 at the output of the data latch 525 to open. Data is held at the input D of the output latch 555 until a rising edge 603 of the anticipatory clock signal AC# transfers the data to the output pad 501. A short time thereafter (e.g., time sufficient to meet hold time requirements of the output latch 555), the flip-flop 535 is reset responsive to the rising edge of the anticipatory clock signal AC#, driving the control signal OPEN to a logic high. This opens the switch 520 and closes the bypass switch 515, such that data next appearing at the output of the memory 510 is presented to the input D of the output latch 555. As shown in FIG. 6B, the period during which the control signal OPEN is "low" decreases as the skew between the input clock signal K and the anticipatory clock signal AC# decreases.

As shown in FIG. 6C, when the skew becomes sufficiently small, the alignment control signal OPEN may remain "high" for extended periods, as the "data valid" period for data produced from the memory 510 in synchronism with the input clock signal K sufficiently coincides with the rising edges of the anticipatory clock signal AC# to allow the bypass switch 515 to remain consistently closed. In this configuration, the control signal OPEN can remain continuously high due to suppression of generation of reset pulses from the input clock signal K. Referring to FIG. 5 again, the second pulse generator circuit 545 (which resets the flip-flop 535) may be responsive to the first pulse generator circuit 550 (which sets the flip-flop 535) such that a blanking interval 604 is created, i.e., such that generation of reset pulses from the second pulse generator circuit 545 is suppressed if the rising edge of the anticipatory clock signal AC# coincides with or slightly precedes the rising edge of the input clock signal K.

Figure 7:
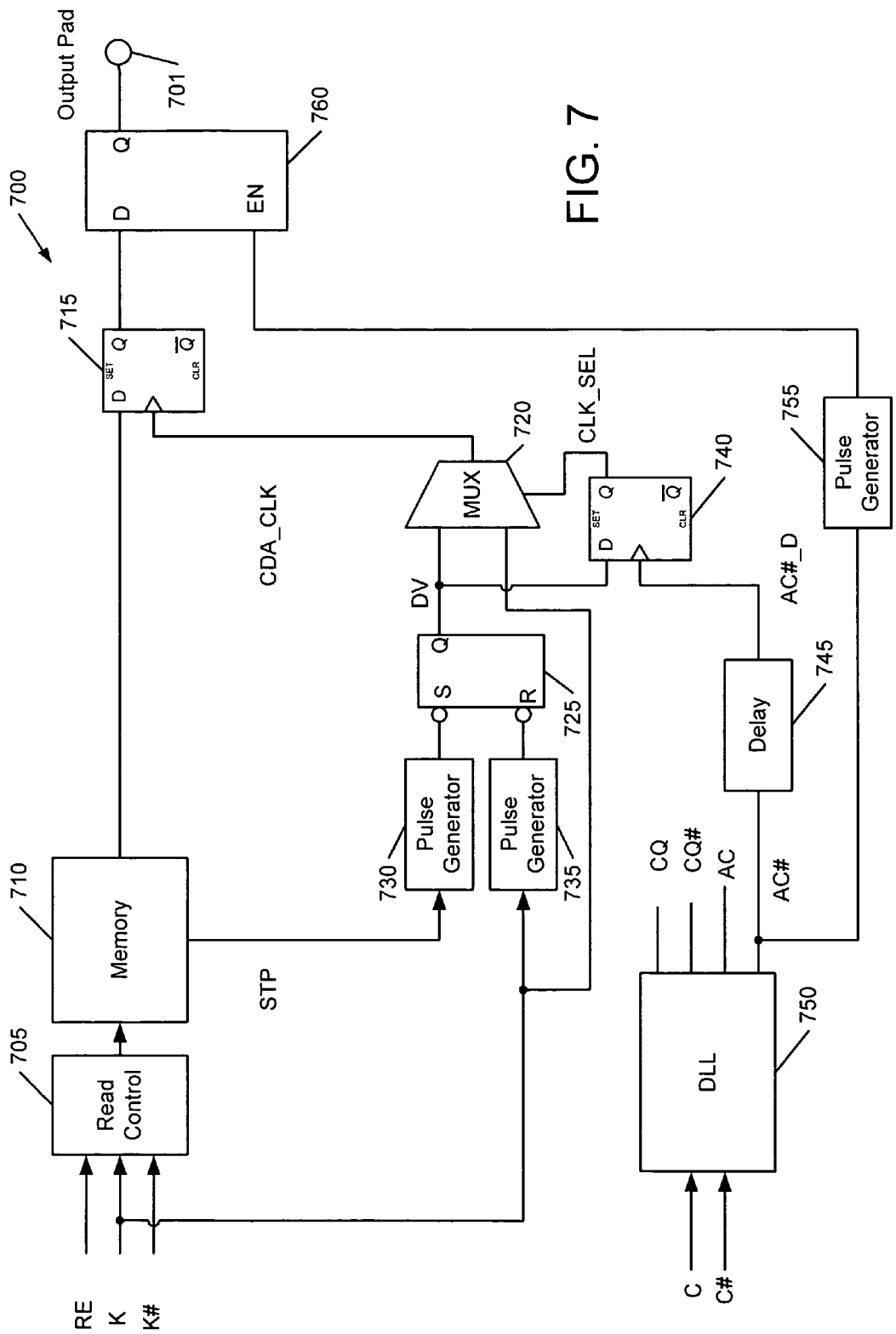
FIG. 7 is a schematic diagram illustrating a memory device according to additional embodiments of the present invention.

FIG. 7 illustrates a memory device 700 according to further embodiments of the present invention. The device 700 includes a read control circuit 705 and a memory 710. The read control circuit 705 is operative to produce data from the memory 710 in synchronism with the input clock signal K and provides the data to an input D of a clock domain alignment latch 715 of a clock domain alignment circuit that includes pulse generators 730, 735, an SR flip-flop 725, a data valid latch 740 and a delay circuit 745. The clock domain alignment latch 715 is used to transfer data to an input D of an output latch 760 and to hold data at the input D of the output latch 760 based on a timing relationship between the input clock signal K and an anticipatory clock signal AC# that controls transfer of data through the output latch 760 to an output pad 701. In order to properly operate the clock domain alignment latch 715 over a range of timing relationships between the input clock signal K and the anticipatory clock signal AC#, a clock domain alignment clock signal CDA_CLK is generated by comparing a self-timed pulse signal STP, which is a read cycle status signal generated by the memory 710 during a read operation, to the anticipatory clock signal. The self-timed pulse signal STP is used for timing of operations in the memory, such as word line, precharge and sense amp timing. As shown in FIG. 7, the self-timed pulse signal STP and the input clock signal K are used to respectively set and reset the SR flip-flop 725 to produce a data valid signal DV. In particular, a rising edge of the self-timed pulse signal STP generates a pulse that brings the data valid signal DV high (indicating valid data is present at the output of the memory 710) and a rising edge of the input clock signal K generates a pulse that brings the data valid signal DV low (indicating the end of the data valid period).

As shown, a delayed version AC#_D of the anticipatory clock signal AC# is used to sample the data valid signal DV and responsively generate a select signal CLK_SEL to control the mux 720, such that either the data valid signal DV or the input clock signal K is used for the clock signal CDA_CLK that clocks the clock domain alignment latch 715. If the data valid signal DV is low when the delayed anticipatory clock signal AC#_D goes high, then the output latch 760 will be enabled relatively early in the cycle. Accordingly, the data valid signal DV is passed through the mux 720 to the clock domain alignment latch to ensure that there is sufficient time to pass the data to the input D of the output latch 760. However, if the data valid signal DV is high when the delayed anticipatory clock signal AC#_D goes high, this means that the output latch 760 will be enabled later in the cycle and that the input clock signal K should be used to clock the clock domain alignment latch 715.

The delayed anticipatory clock signal AC#_D is used to clock the flip-flop 740 to avoid a condition in which the data valid signal DV goes high at the same time that the anticipatory clock signal AC# goes high, which could cause instability. The use of the delayed clock signal AC#_D can ensure that, when the data valid signal DV goes high at the same time as the anticipatory clock signal AC#, the clock select signal CLK_SEL will always be high, and the input clock signal K will be selected to generate the clock signal CDA_CLK. This would be appropriate, as the data valid signal DV would be going high relatively late in the cycle, which would provide sufficient time for the input clock signal K to be used to generate the clock signal CDA_CLK. Another possibility is that the data valid signal DV could go high when the delayed anticipatory clock signal AC#_D goes high. This could cause the flip-flop 740 to register a high or a low. However, unlike the previously described condition, this indeterminacy is acceptable. If the data valid signal DV goes high when the delayed anticipatory clock signal AC#_D goes high, it implies that the data valid signal DV goes high after the anticipatory clock signal AC# has gone high. If the input clock signal K is selected to generate the clock signal CDA_CLK, no error should occur, as the output latch 760 will be clocked sufficiently far away from the rising edge of the input clock signal K to meet setup requirements. In addition, latency should be correct because the output latch 760 will have transferred data from the previous cycle before the clock signal CDA_CLK goes high. If the data valid signal DV is instead selected, no error will occur because the output latch 760 will have already been clocked before the data valid signal DV goes high. Care should be taken to ensure that the clock select signal CLK_SEL does not transition at a point in the cycle that could cause the clock signal CDA_CLK to miss an edge or otherwise incorrectly clock the clock domain alignment latch 715.

In the drawings and specification, there have been disclosed exemplary embodiments of the invention. Although specific terms are employed, they are used in a generic and descriptive sense only and not for purposes of limitation, the scope of the invention being defined by the following claims.

That which is claimed is:

1. An integrated circuit memory device, comprising:
    a memory;
    a read control circuit operatively associated with the memory and configured to produce data from the memory responsive to an externally applied input clock signal;
    an output latch configured to transfer data at an input thereof to an output pad of the memory device responsive to an externally-applied output clock signal; and
    a clock domain alignment circuit configured to receive the data produced by the memory and to responsively provide the data at the input of the output latch based on relative timing of the input clock signal and the output clock signal.

2. A device according to claim 1, wherein the clock domain alignment circuit comprises:
    a data input configured to receive the data produced by the memory;
    a data latch having an input coupled to the data input and configured to transfer data to the input of the output latch and to hold data at the input of the output latch responsive to an alignment control signal;
    a switch configured to couple the data input to the input of the output latch to bypass the data latch responsive to the alignment control signal; and
    a control circuit that generates the alignment control signal responsive to the input clock signal and the output clock signal.

3. A device according to claim 2, further comprising a delay locked loop circuit that generates an anticipatory clock signal that is synchronized with the externally-applied output clock signal, an output latch enable pulse generator that generates respective output latch enable pulses corresponding to respective edges of the anticipatory clock signal, wherein the output latch transfers data from its input to the external pin responsive to the output latch enable pulses, and wherein the control circuit comprises:
    a first pulse generator that generates respective pulses corresponding to respective edges of the anticipatory clock signal;
    a second pulse generator that generates respective pulses corresponding to respective edges of the input clock signal; and
    a flip-flop that generates the alignment control signal responsive to the pulses generated by the first and second pulse generators.

4. A device according to claim 3, wherein the second pulse generator is configured to suppress generation of pulses within a predetermined time interval with respect to pulses from the first pulse generator.

5. A device according to claim 1, further comprising a delay locked loop circuit that generates an anticipatory clock signal that is synchronized with the output clock signal, wherein the output latch transfers data to the output pad responsive to the anticipatory clock signal, and wherein the clock domain alignment circuit is configured to drive the input of the output latch based on relative timing of the input clock signal and the anticipatory clock signal.

6. A device according to claim 1, further comprising a read control circuit operative to initiate a read of the memory and to responsively produce a read cycle status signal, and wherein the clock domain alignment circuit transfers data to the output latch based on relative timing of the read cycle status signal and the output clock signal.

7. A device according to claim 6, further comprising a delay locked loop circuit that generates an anticipatory clock signal that is synchronized with the externally-applied output clock signal, wherein the output latch transfers data responsive to the anticipatory clock signal, and wherein the clock domain alignment circuit comprises:
    a clock domain alignment latch that receives data from the memory and transfers the data to the output latch responsive to a signal at a clock signal input thereof;
    a data valid signal generator that generates a data valid signal indicative of the presence of valid data at an output of the memory responsive to the read cycle status signal;
    a delay circuit that generates a delayed anticipatory clock signal from the anticipatory clock signal;
    a latch that samples the data valid signal responsive to the delayed anticipatory clock signal to generate a select signal; and
    a mux that selectively applies the data valid signal and the input clock signal to the clock signal input of the clock domain alignment latch.

8. A method according to claim 1, wherein the memory device further comprises a delay locked loop circuit that generates an anticipatory clock signal that is synchronized with the output clock signal pair, wherein the output latch transfers data responsive to the anticipatory clock signal, and wherein transferring the data comprises:
  generating a data valid indicative of the presence of valid data at an output of the memory responsive to the read cycle status signal;
  generating a delayed anticipatory clock signal from the anticipatory clock signal;
  sampling the data valid signal responsive to the delayed anticipatory clock signal to generate a select signal; and
  selecting one of the data valid signal or one of the input clock signals to apply to a clock signal input of a clock domain alignment latch responsive to the sampled data valid signal; and
  transferring the data from the input of the clock domain alignment latch to the output latch responsive to the selected signal.

9. An integrated circuit memory device, comprising:
  a memory;
  a memory interface circuit configured to receive a complementary input clock signal pair and a complementary output clock signal pair, operative to initiate reading of the memory synchronous with the input clock signal pair, and comprising an output latch configured to transfer read data at an input thereof to an output pad of the memory device responsive to the output clock signal pair; and
  a clock domain alignment circuit configured to receive data from the memory and to selectively hold the data at the input of the output latch based on relative timing of the input clock signal pair and the output clock signal pair.

10. A device according to claim 9, wherein the clock domain alignment circuit comprises:
  a data input configured to receive the data produced by the memory;
  a data latch having an input coupled to the data input and configured to transfer the data to the input of the output latch and to hold the data at the input of the output latch responsive to an alignment control signal;
  a switch configured to couple the data input to the input of the output latch to bypass the data latch responsive to the alignment control signal; and
  a control circuit that generates the alignment control signal responsive to one of the input clock signals and one of the output clock signals.

11. A device according to claim 10, further comprising a delay locked loop circuit that generates an anticipatory clock signal that is synchronized with the output clock signal pair, an output latch enable pulse generator that generates respective output latch enable pulses corresponding to respective edges of the anticipatory clock signal, wherein the output latch transfers data from its input to the external pin responsive to the output latch enable pulses, and wherein the control circuit comprises:
  a first pulse generator that generates respective pulses corresponding to respective edges of the anticipatory clock signal;
  a second pulse generator that generates respective pulses corresponding to respective edges of one the input clock signals; and
  a flip-flop that generates the alignment control signal responsive to the pulses generated by the first and second pulse generators.

12. A device according to claim 11, wherein the second pulse generator is configured to suppress generation of pulses within a predetermined time interval with respect to pulses generated by the first pulse generator.

13. A device according to claim 9, further comprising a delay locked loop circuit that generates an anticipatory clock signal that is synchronized with the output clock signal pair, wherein the output latch transfers data to the output pad responsive to the anticipatory clock signal, and wherein the clock domain alignment circuit is configured to drive the input of the output latch based on relative timing of the input clock signal pair and the anticipatory clock signal.

14. An integrated circuit memory device, comprising:
  a memory; and
  a memory interface circuit configured to receive a complementary input clock signal pair and a complementary output clock signal pair, operative to initiate reading of the memory synchronous with the input clock signal pair and to generate a read cycle status signal indicative of a status of a data read cycle of the memory, and comprising an output latch configured to transfer read data at an input thereof to an output pad of the memory device responsive to the output clock signal pair; and
  a clock domain alignment circuit configured to transfer data to the input of the output latch based on relative timing of the read cycle status signal and the output clock signal pair.

15. A device according to claim 14, further comprising a delay locked loop circuit that generates an anticipatory clock signal that is synchronized with the output clock signal pair, wherein the output latch transfers data responsive to the anticipatory clock signal, and wherein the clock domain alignment circuit comprises:
  a clock domain alignment latch that receives data from the memory and transfers the data to the output latch responsive to a signal at a clock signal input thereof;
  a data valid signal generator that generates a data valid signal indicative of the presence of valid data at an output of the memory;
  a delay circuit that generates a delayed anticipatory clock signal from the anticipatory clock signal;
  a latch that samples the data valid signal responsive to the delayed anticipatory clock signal to generate a select signal; and
  a mux that selectively applies the data valid signal and one of the input clock signal pair to the clock signal input of the clock domain alignment latch responsive to the select signal.

16. A method of operating an integrated circuit memory device having a memory interface circuit configured to provide an input/output interface including an input clock signal pair and an output clock signal pair, the method comprising:
  producing data from a memory of the device synchronous with the input clock signal pair;
  selectively holding the data at the input of an output latch of the memory device based on relative timing of the input clock signal pair and the output clock signal pair; and
  transferring data from the input of the output latch to an external pad of the memory device responsive to the output clock signal pair.

17. A method according to claim 16, wherein selectively holding comprises:
  generating an alignment control signal responsive to one of the input clock signals and one of the output clock signals;
  receiving the data from the memory device at an input of a data latch and at a switch configured to couple the memory to the input of the output latch and operative to bypass the data latch; and
  selectively holding data at the input of the output latch responsive to the alignment control signal or bypassing the data latch responsive to the alignment control signal.

18. A method according to claim 17, wherein the memory device further comprises a delay locked loop circuit that generates an anticipatory clock signal that is synchronized with the output clock signal pair, wherein selectively holding comprises selectively holding the data at the input of an output latch of the memory device based on relative timing of one of the input clock signals and the anticipatory clock signal, and wherein transferring the data from the input of the output latch to an external pad of the memory device responsive to the output clock signal pair comprises transferring the data from the input of the output latch to the external pad responsive to the anticipatory clock signal.

19. A method according to claim 18, wherein selectively holding the data at the input of an output latch of the memory device based on relative timing of the input clock signal pair and the anticipatory clock signal comprises:
  generating an alignment control signal responsive to one of the input clock signals and the anticipatory clock signal;
  receiving the data from the memory device at an input of a data latch and at a switch configured to couple the memory to the input of the output latch and operative to bypass the data latch; and
  selectively holding data at the input of the output latch responsive to the alignment control signal or bypassing the data latch responsive to the alignment control signal.

20. A method of operating an integrated circuit memory device having a memory interface circuit configured to provide an input/output interface comprising a input clock signal pair and an output clock signal pair, the method comprising:
  producing data from a memory of the device synchronous with the input clock signal pair;
  transferring the data to an input of an output latch of the memory device based on relative timing of the output clock signal pair and a read cycle status signal indicative of a status of data read cycle of the memory; and
  transferring data from the input of the output latch to an external pad of the memory device responsive to the output clock signal pair.

* * * * *